US 6,738,261 B2

(12) United States Patent
Vier et al.

(10) Patent No.: US 6,738,261 B2
(45) Date of Patent: *May 18, 2004

(54) EXPANSION CARD RETAINER

(75) Inventors: Bradford E. Vier, Austin, TX (US); Robert Poe, Liberty Hill, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 10/436,284

(22) Filed: May 12, 2003

(65) Prior Publication Data

US 2003/0206406 A1 Nov. 6, 2003

Related U.S. Application Data

(62) Division of application No. 09/906,635, filed on Jul. 16, 2001, now Pat. No. 6,608,765.

(51) Int. Cl.⁷ .............................. H05K 1/14; H05K 7/14; H05K 7/18
(52) U.S. Cl. ..................... 361/740; 361/801; 361/802; 361/686; 361/732; 361/747; 361/741; 361/756; 361/759
(58) Field of Search ................................ 361/740, 741, 361/747, 756, 759, 801, 802, 683, 684, 686, 728, 732, 755, 807; 211/41.17, 26; 312/223.1, 233.2, 216, 273.3, 265.5, 265.6, 183; 439/327, 368; 174/50, 50.51, 50.52, 51, 66, 67

(56) References Cited

U.S. PATENT DOCUMENTS

| 4,924,355 A | 5/1990 | Mitchell et al. |
| 5,317,483 A | 5/1994 | Swindler |
| 5,544,006 A | 8/1996 | Radloff et al. |
| 5,575,546 A | 11/1996 | Radloff |
| 5,757,618 A | 5/1998 | Lee |
| 5,781,414 A | 7/1998 | Mills et al. |
| 5,936,835 A | 8/1999 | Astier |
| 6,111,746 A | 8/2000 | Wahl et al. |
| 6,320,752 B1 | 11/2001 | Jang |
| 6,320,760 B1 | 11/2001 | Flamm et al. |
| 6,608,765 B2 * | 8/2003 | Vier et al. ................... 361/801 |

* cited by examiner

Primary Examiner—Phuong T. Vu
(74) Attorney, Agent, or Firm—Haynes and Boone, LLP

(57) ABSTRACT

An expansion card retainer includes a computer chassis having a card slot formed in a wall of the chassis. A metal tab extends from the wall adjacent the slot. A pivotable bar is attached to the wall. A flexible tongue on the bar is positioned adjacent the card slot for engagement with a card inserted into the slot. A recess in the bar is provided for engagement with the metal tab. A latch is provided on the bar for securing the bar in engagement with the wall.

11 Claims, 5 Drawing Sheets

EXPANSION CARD RETAINER

CROSS-REFERENCE TO RELATED APPLICATIONS

This application is a Divisional of U.S. application Ser. No. 09/906,635, filed on Jul. 16, 2001, now U.S. Pat. No. 6,608,765.

BACKGROUND

The disclosures herein relate generally to computer systems and more particularly to installing expansion cards in such systems.

Mounting peripheral cards into a chassis is tedious and time consuming. This creates greater production cost due to assembly errors and greater assembly time. The common type of peripheral cards also require screws to be driven into the card once it is positioned inside of the computer chassis. This also adds to assembly errors, time and cost.

Traditionally peripheral cards are aligned and secured using screws. Other solutions have incorporated clips and/or screws that secure single and multiple cards. Latches have been implemented but do not possess alignment or force distribution features. Both of these solutions are inadequate and/or create additional parts and handling cost.

Therefore, what is needed is a screwless retainer for securing expansion cards in a computer chassis.

SUMMARY

One embodiment, accordingly, provides a retainer bar that is capable of capturing one or more cards in a single pivotable latching movement. To this end, an expansion card retainer includes an elongated bar. A plurality of flexible tongues extend from the bar. A plurality of recesses are formed in the bar. Each recess is adjacent a respective one of the tongues. A flexible latch also extends from the bar.

A principal advantage of this embodiment is that the card retainer allows for easier access to the expansion cards, thereby permitting faster installation and removal time and easy end user accessibility.

DETAILED DESCRIPTION

Figure 1:
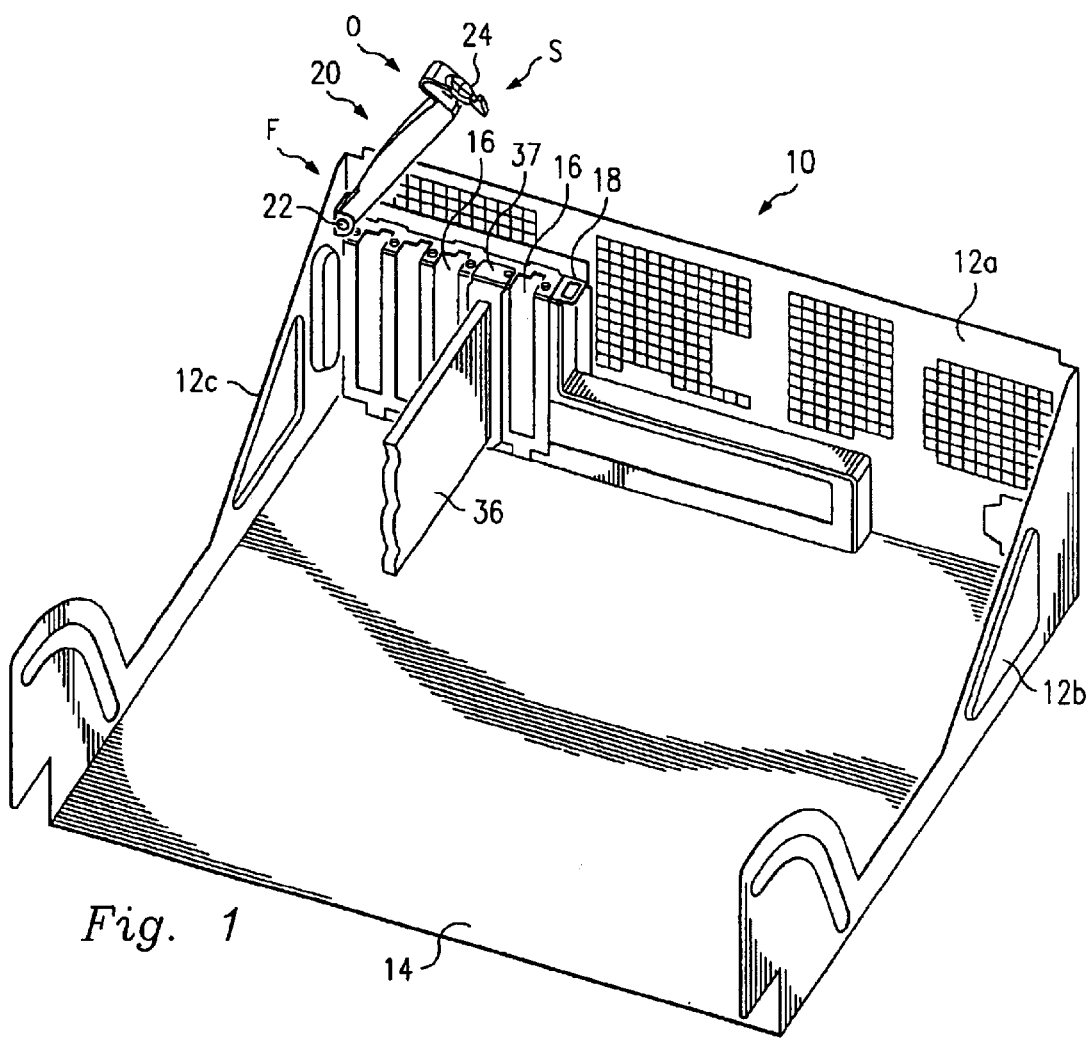
FIG. 1 is a perspective view illustrating an embodiment of a portion of a computer chassis.
Figure 2:
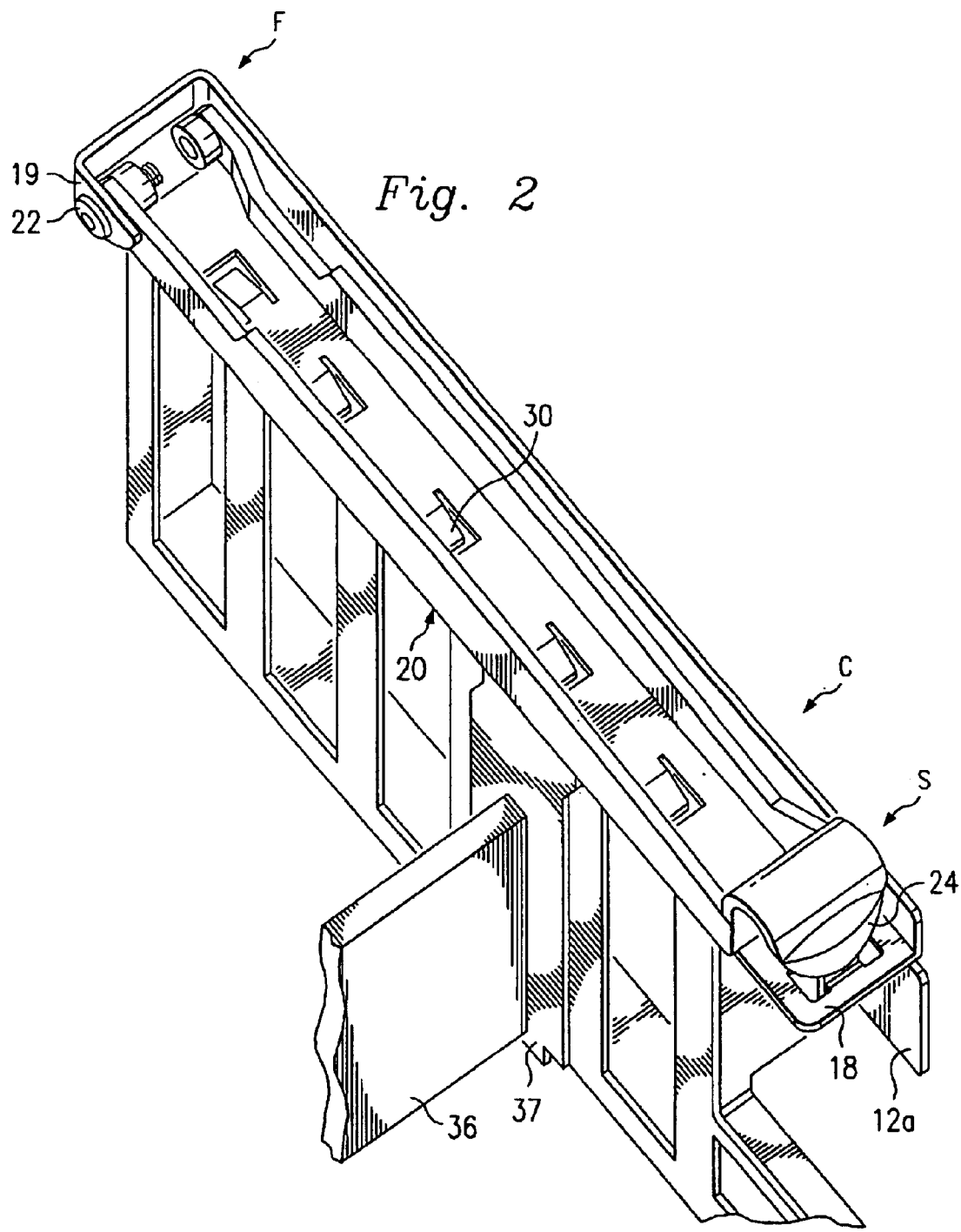
FIG. 2 is a perspective view illustrating an embodiment of an expansion card retainer bar.

A computer chassis is generally designated 10 in FIGS. 1 and 2. Chassis 10 includes a plurality of walls 12a, 12b, 12c and a base 14. One of the walls 12a includes a plurality of card slots 16 formed therein. A portion of the wall 12a has a surface 18 for receiving and supporting an expansion card retainer in the form of a bar 20 pivotally attached to the chassis 10 at a pivot pin 22 extending through a bracket 19 and positioned at a first end F of bar 20. In this manner, bar 20 is pivotable between a first or open position O to a second or closed position C. In the closed position C, a second end S of bar 20 latches to chassis 10 by means of a latch 24, discussed below in greater detail.

Figure 3:
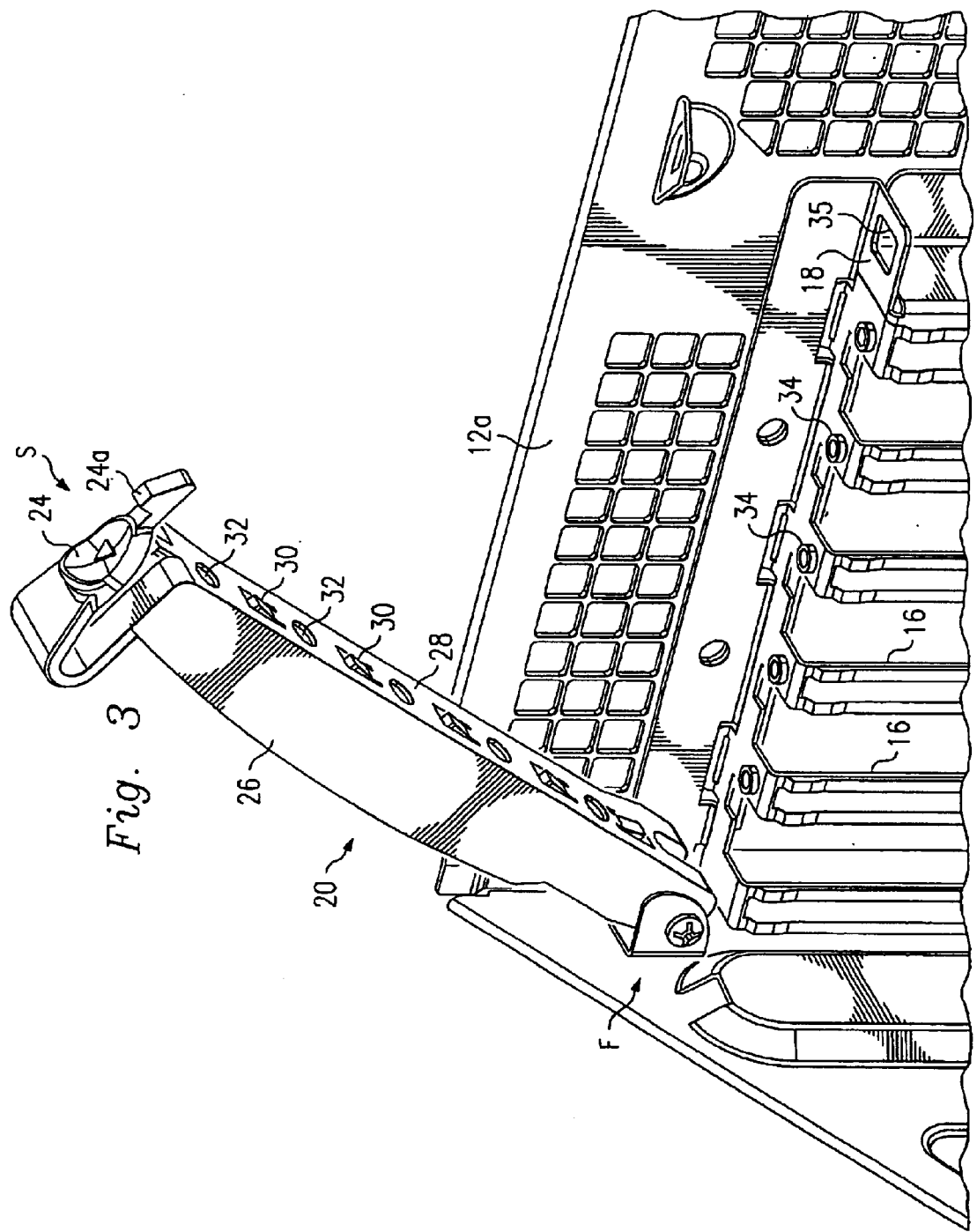
FIG. 3 is a perspective view further illustrating the expansion card retainer bar and a portion of the chassis.
Figure 4:
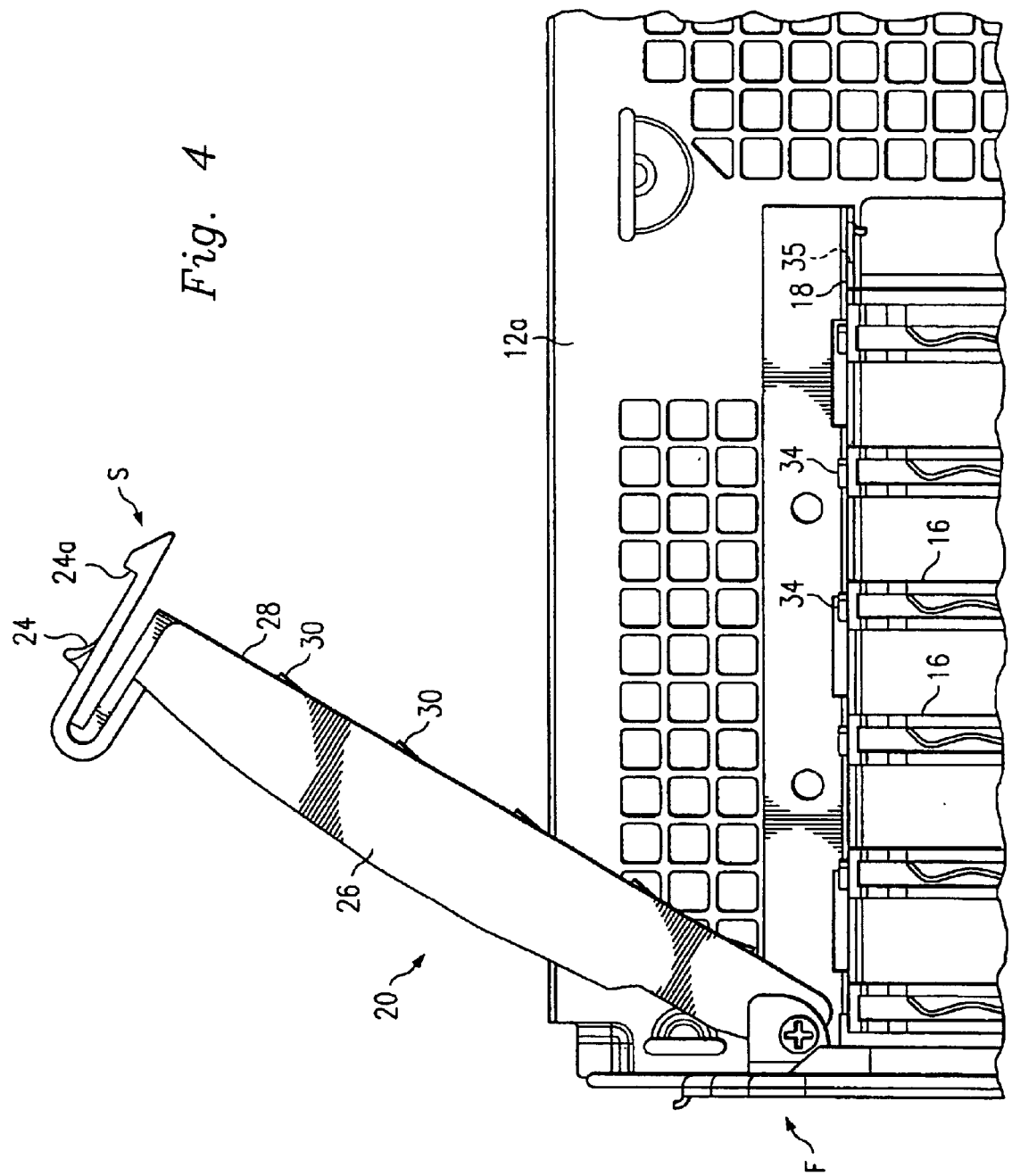
FIG. 4 is a frontal view further illustrating the expansion card retainer bar and a portion of the chassis.
Figure 5:
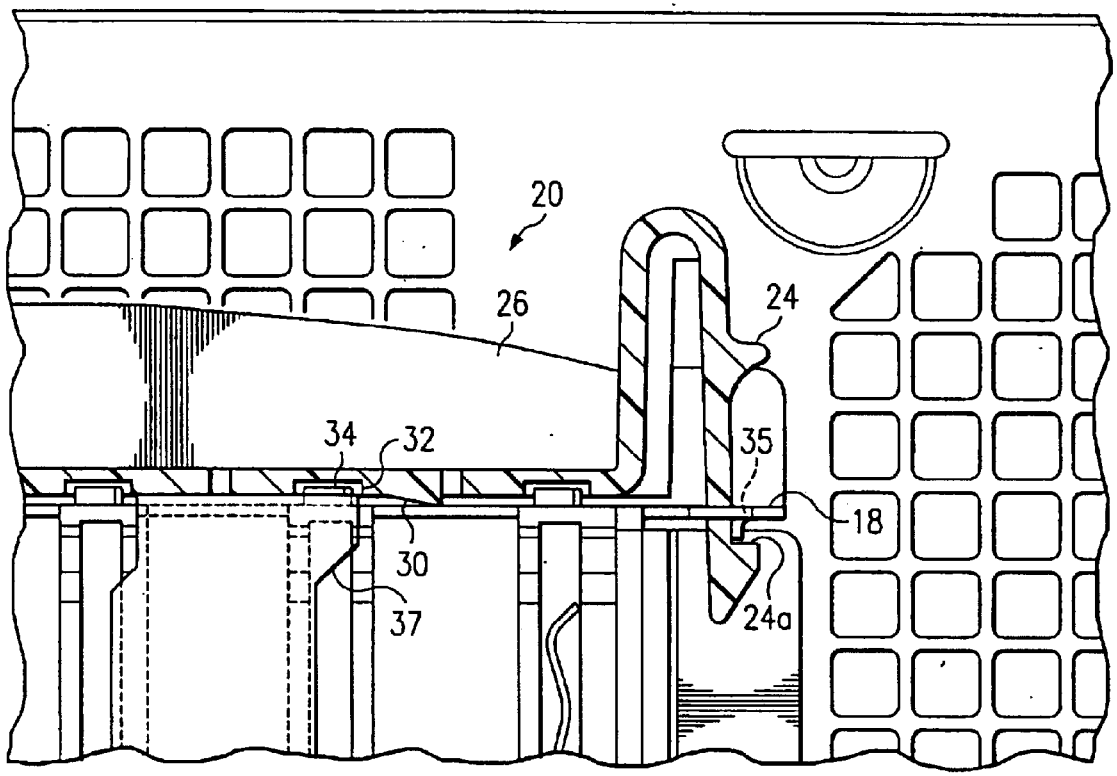
FIGS. 5 and 6 are enlarged partial views further illustrating the expansion card retainer bar and a portion of the chassis.

Bar 20, FIGS. 3–5, includes a curved load distribution member 26 which extends between the first end F and the second end S. A surface 28 of bar 20 which engages surface 18 of wall 12a includes a plurality of spaced apart cantilevered flexible tongues 30. The tongues 30 are spaced to match the spacing of the card slots 16 and extend away from the surface 28. In addition to the tongues 30, a plurality of spaced apart recesses 32 are provided to recess into surface 28 of bar 20, for receiving metal tabs 34, discussed below in further detail. The latch 24 is a flexible member on the second end S of bar 20 and includes a catch 24a formed thereon for engagement with chassis 10. The slots 16 in wall portion 12a extend to the surface 18. The metal tabs 34 extend from surface 18 of wall 12a and are respectively adjacent the slots 16. The tabs 34 assist in retaining the cards (discussed below) which are inserted into the slots 16. A latch receiving slot 35 extends through surface 18 for receiving latch 24 and engaging catch 24a.

Figure 6:
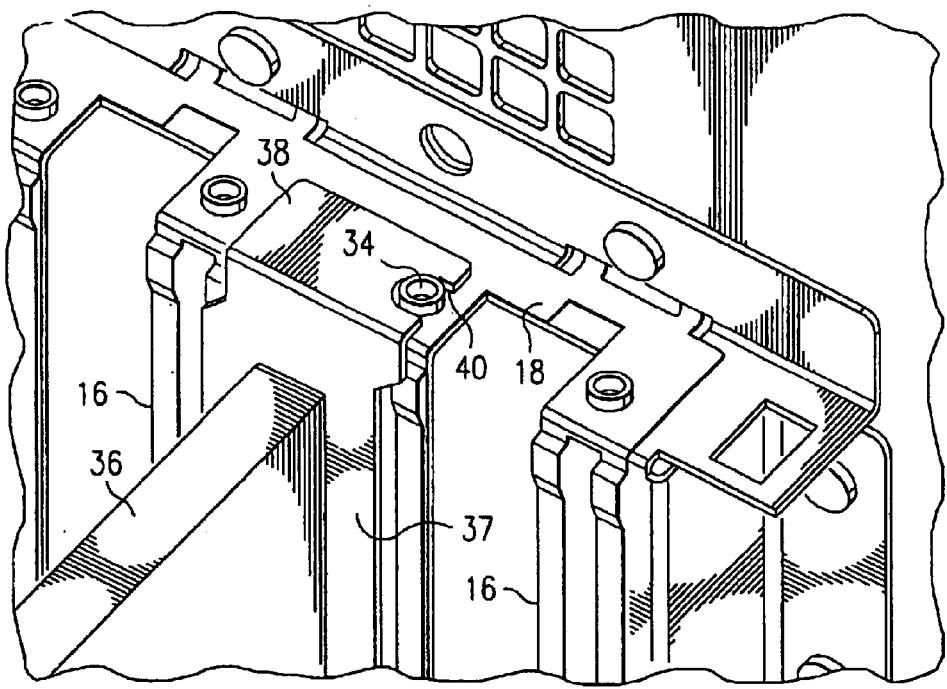

A card 36, FIG. 6, can be mounted in each slot 16 by means of an end bracket 37 including a lip portion 38 seating on the surface 18. A receiver slot 40 in lip portion 38, receives the tab 34. The card 36 extends from the end bracket 37 into the chassis 10, see also FIGS. 1 and 2. When bar 20 is latched, lip portion 38 is sandwiched between surface 18 and bar 20, and tab 34 in slot 40 limits removal of card 36 from slot 16.

Figure 7:
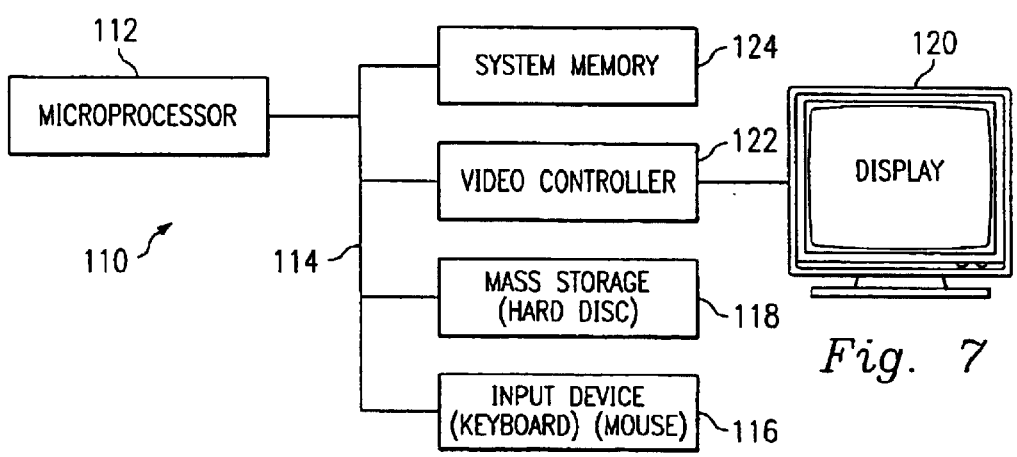
FIG. 7 is a diagrammatic view illustrating an embodiment of a computer system.

In one embodiment, a computer system 110, FIG. 7 includes a microprocessor 112, mounted in chassis 10, and is connected to a bus 114. Bus 114 serves as a connection between microprocessor 112 and other components of computer system 110. An input system 116 is coupled to microprocessor 112 to provide input to microprocessor 112. Examples of input devices include keyboards, touchscreens, and pointing devices such as mouses, trackballs and trackpads. Programs and data are stored on a mass storage device 118, which is coupled to microprocessor 112. Mass storage devices include such devices as hard disks, optical disks, magneto-optical drives, floppy drives and the like. Computer system 110 further includes a display 120, which may be coupled to microprocessor 112 by a video controller 122. A system memory 124 is coupled to microprocessor 112 to provide the microprocessor with fast storage to facilitate execution of computer programs by microprocessor 112. It should be understood that other busses and intermediate circuits can be deployed between the components described above and microprocessor 112 to facilitate interconnection between the components and the microprocessor.

In operation, a card (or cards) 36 is positioned in a slot 16 so that lip portion 38 seats on surface 18 and tab 34 extends through receiver slot 40. Bar 20 is pivoted about pivot pin 22 from the open position O to the closed position C. Latch 24 extends through slot 35 which engages catch 24a for retaining bar 20 in the closed position C. Metal tabs 34 seat in the recesses 32 and tongues 30 are resiliently urged against a respective lip 38. In this manner, cards 36 are retained in slots 16 and loading is distributed along bar 20 due to the curved load member 26. The tongues 30 individually apply an equal pressure to each lip 38 regardless of the number of cards present in the respective slots 16.

For release of the cards 36, latch 24 is flexed to release catch 24a from slot 35 so that bar 20 can be released from slot 35 and can be pivoted from the closed position C to the open position O.

As a result, one embodiment provides a computer chassis comprising a wall including a plurality of card slots formed therein, a metal tab extending from the wall adjacent each slot, a bar having a first end pivotally attached to the chassis, plurality of flexible tongue members on the bar, each tongue member being adjacent a respective slot, a plurality of recesses in the bar for respectively receiving each metal tab, and a latch on a second end of the bar, opposite the first end, for securing the bar in engagement with the chassis.

Another embodiment provides a computer system comprising a chassis having a plurality of card slots formed therein, a microprocessor mounted in the chassis, a storage coupled to the microprocessor, a video controller coupled to the microprocessor, a memory coupled to provide storage to facilitate execution of computer programs by the microprocessor, a metal tab extending from the chassis adjacent each slot, a bar pivotally attached to the chassis, a flexible tongue on the bar adjacent each card slot, a plurality of recesses in the bar for respective engagement with each metal tab, and a latch for securing the bar in engagement with the chassis.

A further embodiment provides a method of retaining an expansion card comprising a computer chassis with a card slot formed in a chassis wall, extending a metal tab from the wall adjacent the slot, mounting a card adjacent the slot, extending a lip of the card into engagement with the metal tab, providing a bar pivotally attached to the chassis, extending a flexible tongue from the bar into engagement with the lip of the card, providing a recess in the bar for receiving the metal tab, and providing a latch on the bar for securing the bar in engagement with the card and the chassis.

As can be seen, the principal advantages of these embodiments are that the card retainer spans the entire length of the mounted cards and is capable of captivating the assembly of cards in one movement without the use of screws. This allows for easier access to the expansion cards, thereby permitting faster installation time and end user accessibility.

The hinged retainer, configured with a snap in place feature, will eliminate screws used to secure the cards by using extruded holes engaged with chassis tabs that will replace the function of the mounting screws. The retainer is closed using a snap rather than screws. By eliminating screws, assembly time will be shortened, card damage reduced, and screw cost will be saved.

The retainer also incorporates two curved ribs that allow a uniform distribution of pressure across each individual card. Previous designs did not have this and cards towards the center of the beam did not receive ample pressure to be locked in place.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. An expansion card retainer comprising:
   an elongated bar having opposite ends and comprising a surface and a beam extending from the surface, the beam having a constant radius curved portion providing a variable height such that a maximum height of the beam is between the opposite ends;
   a plurality of flexible tongues extending from the surface of the bar;
   a plurality of recesses formed in the surface of the bar, each of the recesses being adjacent a respective one of the flexible tongues; and
   a flexible latch extending from the bar.
2. The retainer as defined in claim 1 wherein the bar includes a pair of spaced apart beams.
3. The retainer as defined in claim 1 wherein each flexible tongue is a cantilever member formed on the bar.
4. The retainer as defined in claim 1 wherein the bar includes a first one of the opposite ends having a pivotal connection.
5. The retainer as defined in claim 4 wherein the bar includes a second one of the opposite ends, the second end including the latch.
6. An expansion card retainer comprising:
   a computer chassis including card slots formed in a wall of the chassis;
   a metal tab extending from the wall adjacent each slot;
   a card mounted adjacent each slot;
   a lip extending from each card, each lip engaged with a respective metal tab;
   a pivotable bar attached to the chassis having opposite ends and comprising a surface and a beam extending from the surface, the beam having a constant radius curved portion providing a variable height such that a maximum height of the beam is between the opposite ends;
   a flexible tongue on the bar for engagement with each card;
   a recess in the bar for engagement with each metal tab; and
   a latch for securing the bar in engagement with the chassis.
7. The retainer as defined in claim 6 wherein the bar includes a pair of spaced apart beams.
8. The retainer as defined in claim 6 wherein the flexible tongue is a cantilever member formed in the bar.
9. The retainer as defined in claim 6 wherein the bar includes a first one of the opposite ends pivotally attached to the wall.
10. The retainer as defined in claim 9 wherein the bar includes a second one of the opposite ends, and the latch is a flexible member on the second end of the bar.
11. A method of retaining an expansion card comprising:
   providing a computer chassis with a card slot formed in a chassis wall;
   extending a metal tab from the wall adjacent the slot;
   mounting a card adjacent the slot;
   extending a lip of the card into engagement with the metal tab;
   providing a bar pivotally attached to the chassis having opposite ends and comprising a surface and a beam extending from the surface, the beam having a constant radius curved portion providing a variable height such that a maximum height of the beam is between the opposite ends;
   extending a flexible tongue from the bar into engagement with the lip of the card;
   providing a recess in the bar for receiving the metal tab, and
   providing a latch on the bar for securing the bar in engagement with the card and the chassis.

* * * * *